United States Patent
Maeda et al.

(10) Patent No.: US 6,601,752 B2
(45) Date of Patent: Aug. 5, 2003

(54) ELECTRONIC PART MOUNTING METHOD

(75) Inventors: Yukihiro Maeda, Kasugai (JP); Yuji Ootani, Okazaki (JP); Tetsuo Nakano, Toyoake (JP); Takashi Nagasaka, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/801,855

(22) Filed: Mar. 9, 2001

(65) Prior Publication Data
US 2001/0020635 A1 Sep. 13, 2001

(30) Foreign Application Priority Data
Mar. 13, 2000 (JP) ........................ 2000-073964

(51) Int. Cl.⁷ ............................... B23K 20/10
(52) U.S. Cl. ................... 228/180.5; 228/110.1
(58) Field of Search ................. 228/180.5, 110.1, 228/180.22, 4.5, 180.21, 248.1, 245, 246, 254; 257/666, 676, 778, 784

(56) References Cited

U.S. PATENT DOCUMENTS

| | | | |
|---|---|---|---|
| 4,430,152 A | * 2/1984 | Okano | 134/2 |
| 4,442,967 A | 4/1984 | van de Pas et al. | |
| 4,845,543 A | * 7/1989 | Okikawa et al. | 257/738 |
| 5,090,119 A | 2/1992 | Tsuda et al. | |
| 5,172,851 A | 12/1992 | Matsushita et al. | |
| 5,252,519 A | * 10/1993 | Nakatani et al. | 252/514 |
| 5,299,729 A | 4/1994 | Matsushita et al. | |
| 5,328,079 A | 7/1994 | Mathew et al. | |
| 5,364,009 A | 11/1994 | Takahashi et al. | |
| 5,485,949 A | 1/1996 | Tomura et al. | |
| 5,647,942 A | * 7/1997 | Haji | 156/281 |
| 5,665,639 A | * 9/1997 | Seppala et al. | 228/180.22 |
| 5,838,071 A | * 11/1998 | Horibe et al. | 228/904 |
| 5,842,628 A | 12/1998 | Nomoto et al. | |
| 6,112,969 A | * 9/2000 | Horibe et al. | 228/1.1 |
| 6,316,822 B1 | * 11/2001 | Venkateshwaran et al. | 257/666 |

FOREIGN PATENT DOCUMENTS

| | | |
|---|---|---|
| JP | 62-115748 | 5/1987 |
| JP | 1-293626 | 11/1989 |
| JP | 2-12919 | 1/1990 |
| JP | 2-86132 | 3/1990 |
| JP | 2-114545 | 4/1990 |
| JP | 3-44050 | 2/1991 |
| JP | 3-66130 | 3/1991 |
| JP | 3-183139 | 8/1991 |
| JP | 4-123434 | 4/1992 |
| JP | 4-127546 | 4/1992 |
| JP | 4-130633 | 5/1992 |
| JP | 4-294552 | 10/1992 |
| JP | 5-211192 | 8/1993 |
| JP | 5-243234 | 9/1993 |
| JP | 7-70559 | 7/1995 |
| JP | 7-93305 | 10/1995 |
| JP | 7-283199 | 10/1995 |
| JP | 8-115936 | 5/1996 |
| JP | 8-162438 | 6/1996 |
| JP | 8-340019 | 12/1996 |
| JP | 10-50755 | 2/1998 |
| JP | 2000-340596 | 12/2000 |

\* cited by examiner

*Primary Examiner*—Tom Dunn
*Assistant Examiner*—Jonathan Johnson
(74) *Attorney, Agent, or Firm*—Posz & Bethards, PLC

(57) ABSTRACT

At the step of printing a wiring portion of a ceramic substrate with a conductive adhesive for mounting an IC chip or a part such as a capacitor other than the IC chip, a wire bonding pad made of gold is formed by the ball bonding method or the like at the portion of the wiring portion to be wire-bonded. After the pad was formed and before the conductive adhesive is printed, a heat treatment is performed to cause a thermal diffusion between the wiring portion and the pad to improve the jointability therebetween.

20 Claims, 8 Drawing Sheets

ELECTRONIC PART MOUNTING METHOD

CROSS REFERENCE TO RELATED APPLICATION

This application is based on and incorporates herein by reference Japanese Patent Application No. 2000-73964 filed on Mar. 13, 2000.

BACKGROUND OF THE INVENTION

1. Field of the Invention

The present invention relates to an electronic part packaging method in which an electronic part is wire bonded to wiring portion.

2. Description of the Related Art

In a conventional packaging method, generally, a conductive jointing material such as a conductive adhesive or solder is arranged over a ceramics substrate having a wiring portion plated on its surface with copper or silver, and an electronic part such as an IC chip is mounted on the conductive jointing material. After that, the wiring portion and the electronic part are then electrically connected by wire bonding with gold.

In this packaging method, jointability or wire-bondability is poor between the wiring portion and the gold wire. In JP-A-10-112471 discloses a method for retaining the wire-bondability by mounting the electronic part such as the IC chip over the conductive jointing material, subsequently by forming a gold bump over the wiring portion by the ball bonding, and by wire-bonding the wiring portion through the gold bump.

However, the packaging method of the conventional method is troubled by problems that the surface of the wiring portion is contaminated with the conductive jointing material, such as the bleeding of the conductive adhesive (i.e., the phenomenon that the component in the resin contained in the conductive adhesive is not hardened but flows out), or the outflow of a solder flux, or the oxidation of the surface of the wiring portion by the heating at the soldering time or at the conductive adhesive hardening time.

Thus, in the conventional method, when the gold bump is formed at the wire bonding portion in the wiring portion, the jointability between the gold bump and the wiring portion is worsened by the aforementioned contamination of the wiring portion surface so that the wire bondability at the wiring portion is deteriorated.

SUMMARY OF THE INVENTION

An object of the present invention is to provide an electronic part mounting method for wire bonding a wiring portion of a wiring substrate and an electronic part mounted on the substrate through a conductive jointing material in which the contamination of the wiring portion with the conductive jointing material is prevented, thereby improving the jointability between the substrate member and the wiring portion.

According to the present invention, a wire bonding pad is formed before a conductive jointing material is arranged over a wiring substrate.

Thus, the problem of the contamination of the wiring portion with the conductive jointing material is intrinsically avoided.

Further, the conductive jointing material is arranged and an electronic part is mounted after the pad is formed, so that a time period until the pad is formed is shortened. Therefore, a time period, for which the surfaces of the wire bonding portions on the wiring portions are exposed, is shortened, thereby suppressing the oxidation of the surfaces to the minimum. Accordingly, the contamination of the wiring portions with the conductive jointing material is prevented to improve the jointability between the pad or the substrate member and the wiring portions.

BRIEF DESCRIPTION OF THE DRAWINGS

Additional objects and advantages of the present invention will be more readily apparent from the following detailed description of preferred embodiments thereof when taken together with the accompanying drawings in which:

FIG. 6A shows a protuberant pad, and FIG. 6B shows a flat pad (second embodiment);

DESCRIPTION OF THE PREFERRED EMBODIMENTS

First Embodiment

Figure 1:
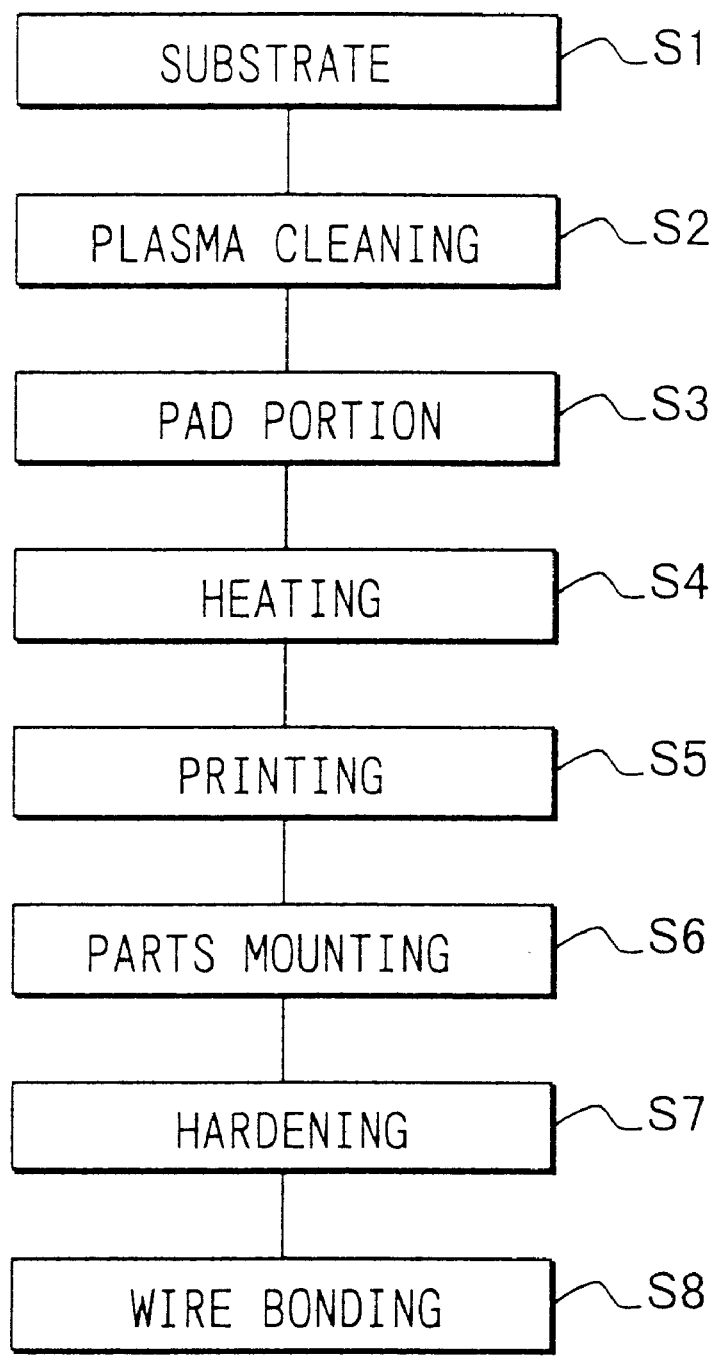
FIG. 1 is a flow chart showing a method of packaging electronic parts (first embodiment)
Figure 2A:
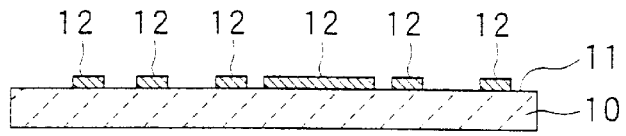
FIGS. 2A–2F are step diagrams for explaining the packaging method shown in FIG. 1 (first embodiment)
Figure 2B:
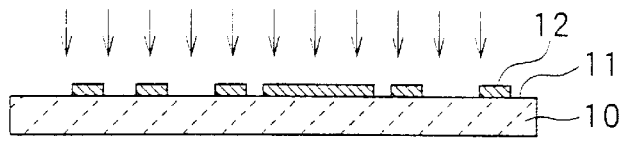
Figure 2C:
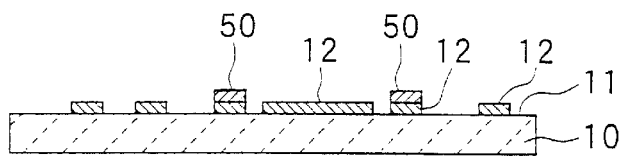
Figure 2D:
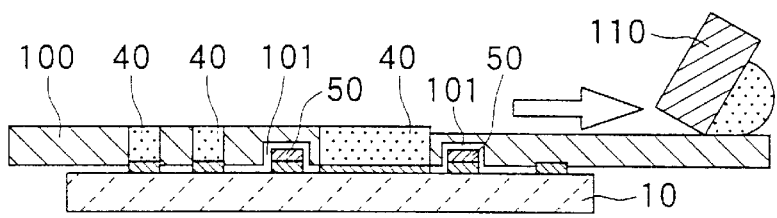
Figure 2E:
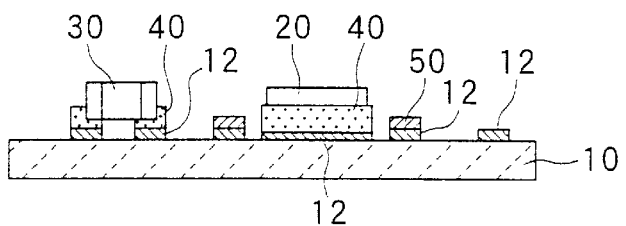
Figure 2F:
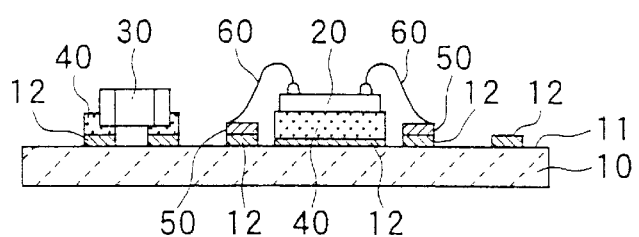

FIG. 1 is a flow chart showing a method of packaging electronic parts according to a first embodiment of the invention, and FIGS. 2A–2F are step diagrams of the packaging method. FIGS. 2A–2E present schematic sectional shapes at intermediate steps for manufacturing the packaged structure of a wire-bonded electronic part, as shown in FIG. 2F.

The packaged structure shown in FIG. 2F is provided with a ceramic substrate 10 made of ceramics such as alumina. An upper face 11 of this ceramic substrate 10, there are formed wiring portions 12 which are made to have surfaces of copper, silver or the like. These wiring portions 12 can be made, for example, of a substrate of tungsten or molybdenum plated with copper or silver.

Partially of the wiring portions 12, there is arranged conductive adhesive 40, through which an IC chip 20 and a part such as a capacitor (i.e., a part which is not wire-bonded, as will be called hereinafter the "non-WB part") 30 are electrically connected with the wiring portions and mounted over the face 11 of the ceramic substrate 10. The conductive adhesive 40 is prepared by mixing a conductive filler such as Ag, Ag/Pd, Ag/Pt, Au, Cu or Ni into a thermoset resin such as epoxy, to acquire a conductivity by their physical contact.

Over the wiring portions 12 around the IC chip 20, moreover, there are formed wire bonding pad (or substrate members) 50 which are made of gold. Here, the pad 50 may be made of metal or alloy as being selected from the group consisting of gold (Au), silver (Ag), aluminum (Al), copper (Cu), palladium (Pd), platinum (Pt), tin (Sn), and nickel (Ni). The pad 50 and the IC chip 20 are electrically connected by wires 60 which are formed by wire-bonding gold. Here will be described a method of packaging this structure, sequentially in the order of steps.

First, at a substrate preparing step S1, as shown in FIG. 2A, there is prepared the ceramic substrate 10 which has the wiring portions 12 formed on the upper face 11. Next, a plasma cleaning step S2 is performed by disposing the ceramic substrate 10 in the chamber of the not-shown plasma generating apparatus.

As shown in FIG. 2B, an atmosphere of a mixed gas of argon and hydrogen in the chamber is prepared by applying an electric field between a pair of electrodes in the apparatus (e.g., 500 to 750 W, for 1 to 3 minutes) so that ion particles ($Ar^+$, $H^+$ or the like) generated by the plasma discharge may collide against the face 11 of the substrate 10 to clean the face 11 containing the wiring portions 12.

Next, at a pad forming step S3, in the wiring portions 12 to be wire-bonded, as shown in FIG. 2C, there are formed the wire bonding pads 50 which are made of gold. With reference to FIGS. 3 and 4, here will be described a variety of methods of forming the pads 50 at the pad forming step S3.

Figure 3A:
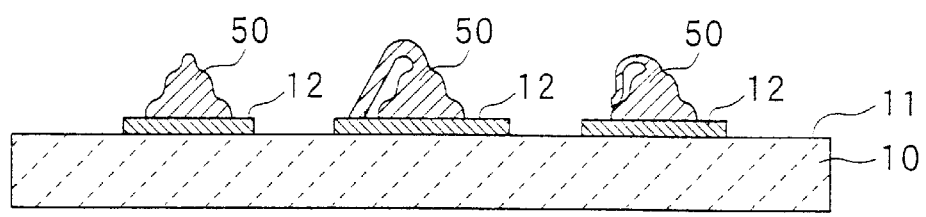
FIGS. 3A–3E are explanatory diagrams showing various pad forming methods (first embodiment)

As shown in FIG. 3A, the pads 50 are formed by using wire bonding wires and the ball bonding method. According to this method, the pads 50 are formed into a variety of protuberant shapes, as shown in FIG. 3A. As described in JP-U-10-112471, more specifically, the pads 50 can be formed by forming bumps by the ball bonding method.

Figure 3B:
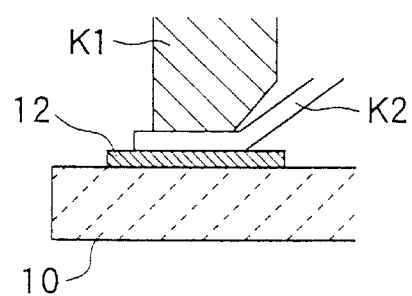
Figure 3C:
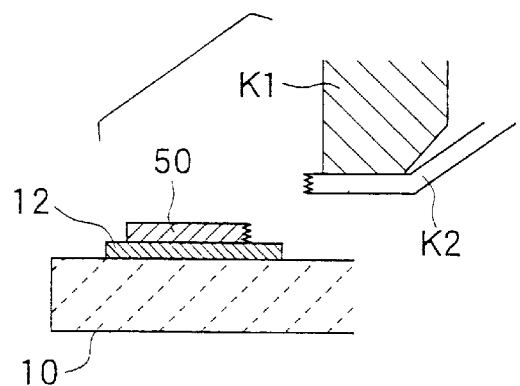

As shown in FIGS. 3B and 3C, the pad 50 is formed by using wiring bonding wire and the wedge bonding method. As shown in FIG. 3B, more specifically, a wedge bonding tool K1 is used to push a gold wire K2 to the wiring portion 12 by vibrating it ultrasonically. After this, as shown in FIG. 3C, the unnecessary portion can be cut off to form the generally flat pad 50.

Figure 3D:
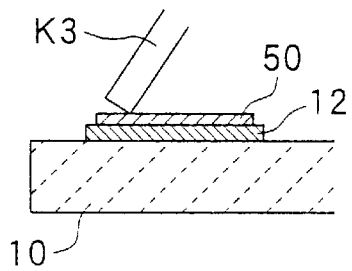
Figure 3E:
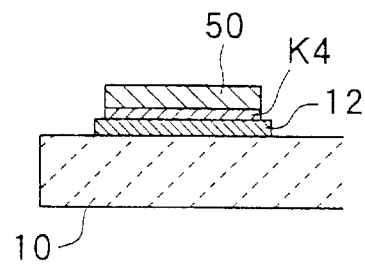

As shown in FIG. 3D, the wiring portion 12 is rubbed on its surface manually or by using a jig or a member (e.g., a gold rod) K3 to form the pad 50 in a film shape on the surface of the wiring pad 12. As shown in FIG. 3E, a gold leaf is adhered to the surface of the wiring portion 12 by means of an adhesive K4 to form the pad 50 in the leaf shape.

The method of forming the leaf pad 50 may be exemplified by a method of heat-contact bonding a gold leaf, as shown in FIG. 4. In this method, a gold leaf (having a thickness of 0.5 microns) K5 is opposed at first (as shown in FIG. 4A) on its one side of the wiring portions 12 over the ceramic substrate 10. A heat-contact bonding jig K6 having protuberances corresponding to the wiring bonding portions of the wiring portions 12 is used (as shown in FIG. 4B) to heat-contact bond the gold leaf K5 to the surfaces of the wiring portions 12 from the other side of the gold leaf K5.

Figure 4A:
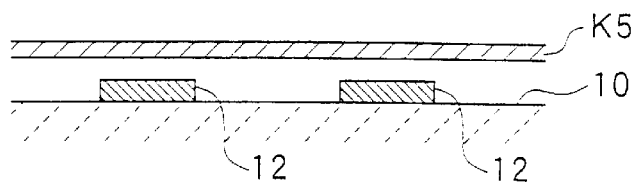
FIGS. 4A–4D are explanatory diagrams showing a method of forming pads by heat-contact bonding a gold leaf (first embodiment)
Figure 4B:
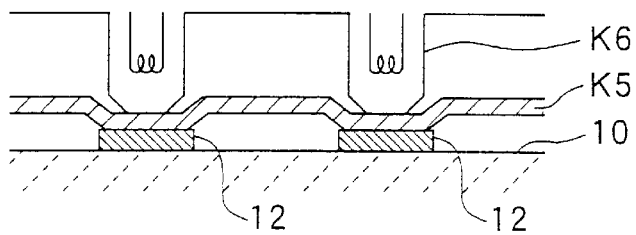
Figure 4C:
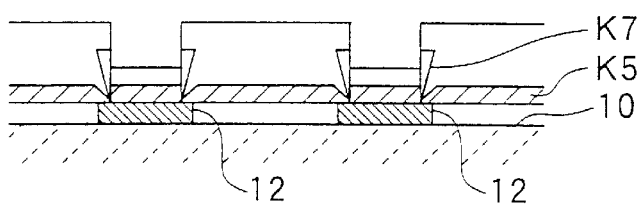
Figure 4D:
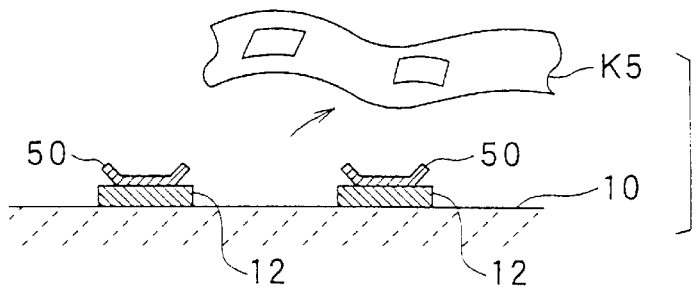

Subsequently, a cutting jig K7 is used (as shown in FIG. 4C) to cut off the surrounding of the heat-contact bonded portion of the gold leaf K5 to remove the unnecessary portion of the gold leaf K5 (as shown in FIG. 4D). Thus, there are formed the leaf-shaped pads 50 which are heat-bonded to the surfaces of the wiring portions 12.

Figure 5:
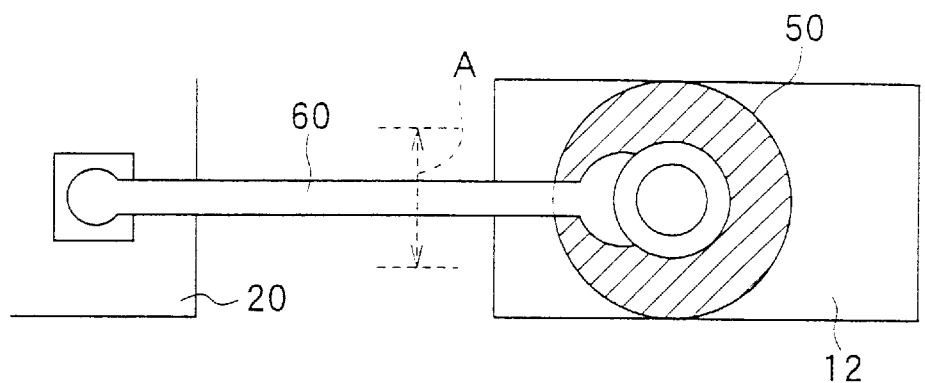
FIG. 5 is a top view showing a top plan shape of the pad (first embodiment)

As described above, the pads 50 are formed by the various methods such as the ball bonding method, the wedge bonding method, the rubbing method of the gold member and the gold leaf adhering method. The top plan shape of the pad 50, as formed over the wiring portion 12, is exemplified in FIG. 5 such that it is connected by the wire 60. Considering the dislocation width A and the precision of the wire 60 by the wire-bonding, as shown in FIG. 5, the (hatched) pad 50 is made larger than the target bonding area.

After the pad 50 was formed at the pad forming step S3, there is performed a heating step S4. At this step S4, the pad 50 and the wiring portion 12 are heated to cause the gold or copper atoms thereof to thermally diffuse across the boundary (e.g., the boundary between gold and copper) between the pad 50 and the wiring portion 12 thereby to improve the adhesion better between the pad 50 and the wiring portion 12.

The heat treatment at this heating step S4 is preferably performed in a nitrogen gas atmosphere or a hydrogen gas atmosphere of a heating furnace so that the remaining portions such as the wiring portions 12 having no pad 50 are prevented from being oxidized. The preferably heating conditions are at 200° C. or higher (e.g., 300° C. in this embodiment) for 10 minutes or longer (e.g., 10 minutes in this embodiment).

Next, there is performed a conductive adhesive printing step (i.e., a step of arranging a conductive jointing material on the wiring substrate) S5. As shown in FIG. 2D, the desired portion, i.e., the portion of the wiring portion 12 on which the IC chip 20 or the non-WB part 30 is mounted, is printed with the pasty conductive adhesive 40 by using a squeezee 110. Here, the upper side 11 of the ceramic substrate 10 is covered with a mask 100 having openings.

This mask is made of a metal such as stainless steel. In the mask 100 of this embodiment, recessed portions (or pad protecting recesses) 101, as recessed at least to a depth corresponding to the thickness of the pad 50, are formed in such positions of the face covering the face 11 of the ceramic substrate 10 as correspond to the pads 50 formed on the wiring portions 12. As a result, the pads 50 are accommodated in and properly protected by the recesses 101 so that they can be prevented from being deformed or the like.

Next, as shown in FIG. 2E, a parts mounting step (or an electronic part mounting step) S6 is performed to mount the IC chip 20 and the non-WB part 30 on the ceramic substrate 10 through the conductive adhesive 40. Subsequently, a hardening step S7 is performed to harden the pasty conductive adhesive 40 to adhere and electrically connect the wiring portions 12 over the ceramic substrate 10, and the IC chip 20 and the non-WB part 30. Here, at the hardening step S7, the heat treatment (e.g., at 150° C. and for 10 minutes) is preferably performed in the atmosphere of $N_2$ so that the other wiring portions 12 may not be oxidized.

After the foregoing individual steps S1 through S7, a wire bonding step S8 is performed. Specifically, the wire bonding is performed using gold wires by setting the IC chip 20 on a primary bonding side and the pads 50 on a secondary bonding side. Thus, the IC chip 20 and the pads 50 are electrically connected by the wires 60 to construct the packaged structure, as shown in FIG. 2F.

Here, according to the packaging method of the present embodiment, before the conductive adhesion printing step (i.e., the step of arranging the conductive jointing material on the wiring substrate) S5, the pad forming step S3 is performed to form the wire bonding pads 50 of gold at portions of the wiring portions 12 to be wire-bonded. As a result, there does not arise the problem such as the contamination of the surfaces of the wiring portions 12 with the conductive adhesive 40, such as bleeding of the conductive adhesive 40 or oxidation of the surfaces of the wiring portions 12 by the heating at the hardening step.

Here, the conductive jointing material may be exemplified by solder. Specifically, in place of the conductive adhesive printing step S5, the pasty solder is printed or applied, and the part mounting step S6 is then performed. In place of the hardening step S7, the solder is caused to reflow to fix the IC chip 20 and so on. Even in this solder using case, according to the present packaging method, it is possible to avoid the problem of the surface contamination of the wiring portions 12 with the solder (or the conductive jointing material), such as the outflow of the solder flux or the oxidation of the surfaces of the wiring portions 12, as caused by the heating at the solder jointing time.

Further, according to the present packaging method, the conductive jointing material arranging step S5 and the electronic part mounting step S6, as performed before the pad forming step in the prior art, are performed after the pad forming step S3 so that the step time period till the pad forming step S3 is shortened. Therefore, the time period, for which the surfaces of the wire bonding portions on the wiring portions 12 are left, can be shortened to suppress the oxidation of the surfaces to the minimum. Therefore, the contamination of the wiring portions 12 with the conductive jointing material 40 is prevented, thereby improving the jointability between the pads 50 and the wiring portions 12.

In the present packaging method, when the pads 50 are formed by using the wire bonding wires, as shown in FIGS. 3A to 3C, they can be formed by the wire bonding apparatus used at the wire bonding step S8, to lower the cost for the apparatus used and to simplify the steps.

Second Embodiment

In the above-described first embodiment, the pads 50 are formed by the various methods such as the ball bonding method, the wedge bonding method, the rubbing method of the gold member and the gold leaf adhering method. When the ball bonding method is used, the pads 50 are formed into the protuberant shape, as shown in FIG. 3A. When the wedge bonding method, the rubbing method of the gold member or the gold leaf adhering method is used, the pads 50 are formed into the flat shape, as shown in FIG. 3C.

Figure 6A:
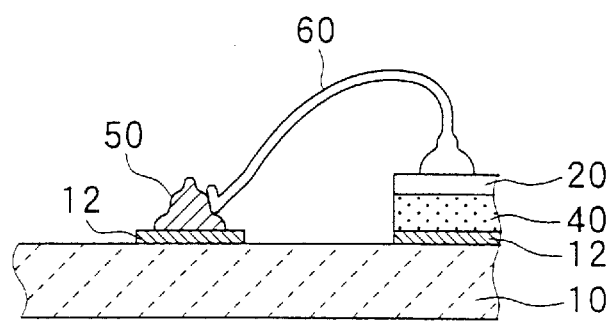
FIGS. 6A and 6B are explanatory diagrams showing a connected state of a wire of the case.
Figure 6B:
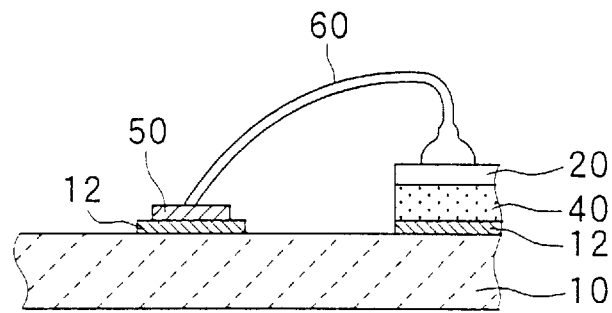

FIGS. 6A and 6B are schematic sectional view showing a connected state of the wire-bonded wire 60. FIG. 6A shows the case of the protuberant pad 50, whereas FIG. 6B shows the case of the flat pad 50. When the ball bonding method is used, the shape of the pad 50 is more complicated than those of the remaining methods. Therefore, a high precision is required for positioning the secondary bonding method and the pad 50, to enlarge the dispersion in the joint strength between the wire 60 and the pad 50.

Even when the pad 50 is formed by the ball bonding method, therefore, it is preferably shaped to flatten the upper portion (the wire bonding portion) of the pad 50. The present embodiment relates to a packaging method in which the protuberant pad 50 is formed by the ball bonding method and is then shaped, and will be described mainly on the differences from the foregoing first embodiment.

Figure 7A:
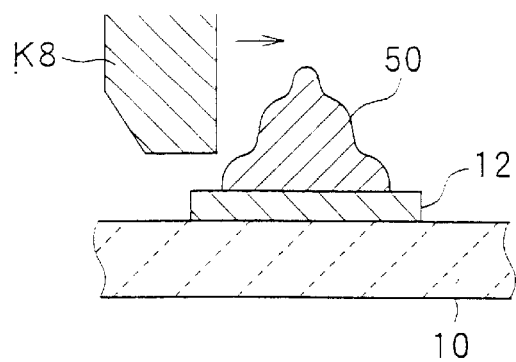
FIGS. 7A–7D are explanatory diagrams showing first and second examples of a pad shaping method (second embodiment)
Figure 7B:
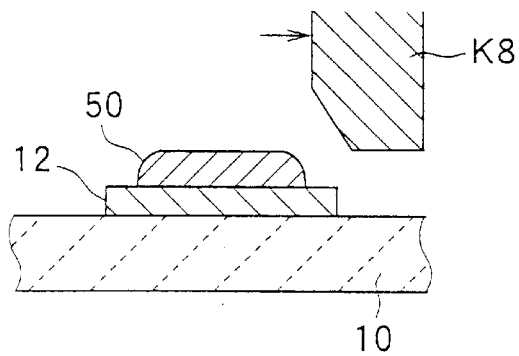

FIGS. 7A–7D are schematic sectional diagrams showing a first example (7A and 7B) and a second example (7C and 7D) of a pad shaping method according to the present embodiment. The first example, as shown in FIGS. 7A and 7B, is a shearing method. In this method, the pad 50 is formed into the protuberant shape, and its leading end side portion is cut off by a shearing jig (or a blade tool) K8 such as a cutter to flatten the surface of the remaining portion.

Figure 7C:
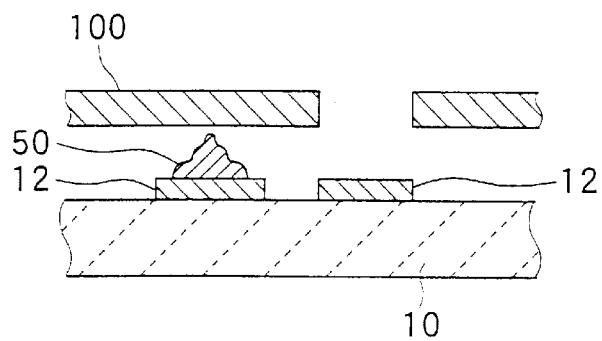
Figure 7D:
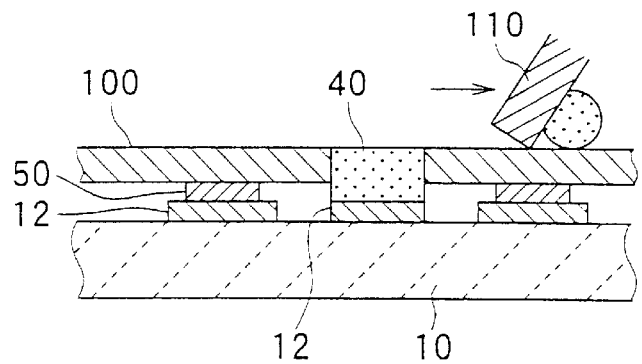

In the second example shown in FIGS. 7C and 7D, the pad 50 is shaped into the protuberant shape, and its leading end side is pushed to deform the surface of the leading end side into the flat shape by using a jig or the like. In the shown example, the mask 100 to be used at the aforementioned conductive adhesive printing step S5 is utilized as the pushing jig.

In FIGS. 7C and 7D, when the upper face 11 of the ceramic substrate 10 is covered with the mask 100, the top of the protuberance of the protuberant pad 50 is pushed by the face (substrate covering face) of the mask 100 covering the upper face 11 of the ceramic substrate 10. This push is executed by utilizing the pressure (squeezee pressure) of the squeezee 110 during the printing step S5.

Here in FIGS. 7C and 7D, the substrate covering face of the mask 100 does not have the pad protecting recess 101, as shown in FIG. 2D, and is generally flat. It is, however, preferable that the recess is formed. The preferred mode of this second example will be described on specific sizes and conditions with reference to the step views (schematic sectional views) shown in FIGS. 8A–8D.

Figure 8A:
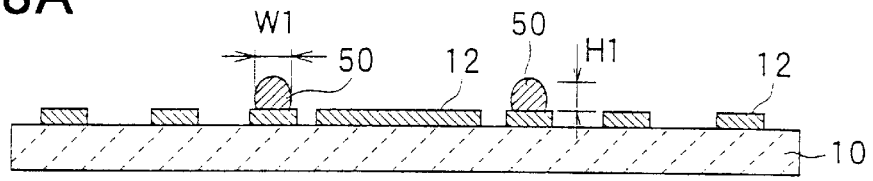
FIGS. 8A–8D are explanatory diagrams showing an example, in which a mask having a pad shaping recess is used, of the second example of the pad shaping method (second embodiment)

FIG. 8A shows the state after the pad 50 was formed by using the ball bonding method (that is, after the heating step S4 in the foregoing first embodiment). At the portions to be wire-bonded of the wiring portions 12 of the ceramic substrate 10, there are formed the protuberant pads 50. In this example, the pad 50 has a height H1 of 60 microns and a width (or the maximum width) W1 of 120 microns.

Figure 8B:
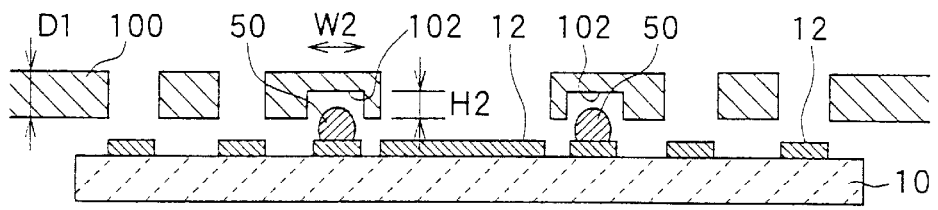

In the mask 100, as shown in FIG. 8B, a recess 102 is formed in such a portion of the face covering the upper face 11 of the ceramic substrate 10 as will push the top end side of the pad 50. The recess 102 is a pad shaping recess and has an object different from that of the pad protecting recess 101 shown in FIG. 2D. In short, the recess 102 is shaped to regulate the degree of deformation of the leading end side of the pad 50 by the push.

In the case of this example in which the IC chip 20 has a land pitch of 400 microns and a land size of 140 square microns, the mask 100 is exemplified by a stainless steel mask having a depth D1 of 70 microns. Moreover, the recess (i.e., the pad shaping recess) 102 can be formed in this example by the etching or plating method to have a depth H2 of 35 microns and an internal diameter W2 of 200 microns.

Figure 8C:
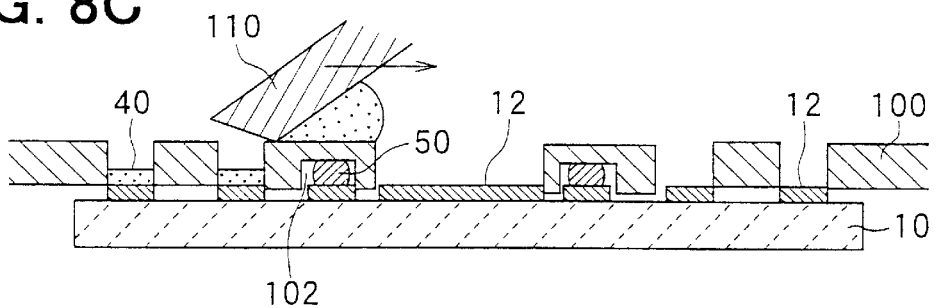
Figure 8D:
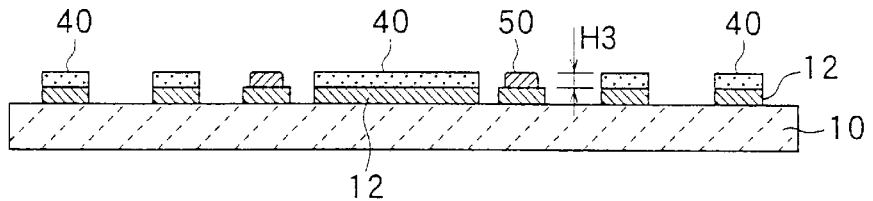

As shown in FIG. 8C, the metallic squeezee 110 is used to push and move the mask 100 in a predetermined direction thereby to print the conductive adhesive 40 or the solder. At this time, the pad 50 in the recess 102 is crushed from its leading end side by the squeezee pressure so that the surface of the leading end side of the pad 50 is finally deformed into the flat shape, as shown in FIG. 8D. In this example, the printing conditions can be the squeezee pressure of 10 Kg, the squeezee moving speed of 30 cm/sec. so that the shaped pad 50 can have a thickness (or height) H3 of 35 to 40 microns.

Here, the depth of the recess 102 is determined on how the pad 50 is to be crushed and deformed. Specifically, the depth of the recess 102 may be shallowed when the pad 50 is to be crushed much. Further, the diameter and shape of the recess 102 have to be selected properly for the shape of the pad 50 to be crushed.

The squeezee pressure is determined by the shape of the pad 50 to be crushed and deformed. A high pressure may be applied for much crush. The squeezee pressure is also determined by the hardness of the pad 50. A high hardness requires a high pressure. Depending upon the moving speed of the squeezee 110, the crush of the pad 50 is so different that it is the larger for the lower speed. For the aforementioned factors, therefore, it is necessary to confirm the proper conditions.

Further, the mask 100 is lifted when it is pushed by the squeezee 110, by the influence of the pad 50, so that the amount of the conductive adhesive 40 or the solder to be transferred may increase. Considering this possibility, the aforementioned printing conditions have to be determined.

As to the mask 100 to be used, the metallic mask is preferable, but a mesh mask may be used when the pad shaping recess 102 is not necessary and when the pad 50 is soft. A proper material for the mask has to be selected depending on the hardness of the pad 50 to be crushed or the printing conditions. The depth of the recess 102 has to be considered because it is limited by the material of the mask 100.

According to the present second embodiment, as described above, the shaping step of the pad is added to the steps of the foregoing first embodiment. Since the surface of the pad 50 to be wire-bonded can be flattened, however, it is possible to avoid the problems of the complicated shape of the pad 50 and the requirement for the high precision in the positioning of the secondary bonding position and the pad 50. Therefore, it is possible to facilitate the wire bonding and to reduce the dispersion in the joint strength between the wire 60 and the pad 50.

In the shaping method utilizing the mask 100 as the pushing jig, the pad 50 can be shaped simultaneously with the aforementioned conductive adhesive printing step S5, so that the number of steps is not increased from that of the foregoing first embodiment. According to the shaping method using the mask having the pad shaping recess 102, moreover, the deformation of the pad 50 by the pushing can be easily made a desired one by shaping the recess 102 suitably.

Figure 9A:
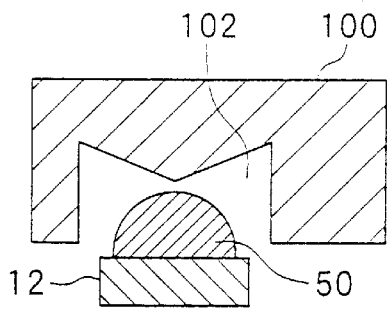
FIGS. 9A–9F are explanatory diagrams showing a variety of modifications for making the pad easily crushable, in the shaping method using the mask (second embodiment).
Figure 9B:
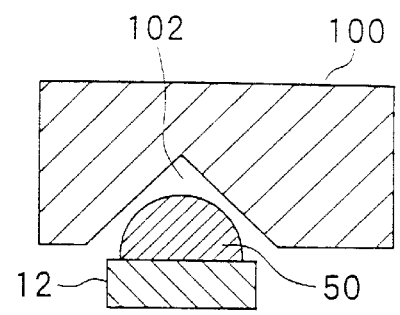
Figure 9C:
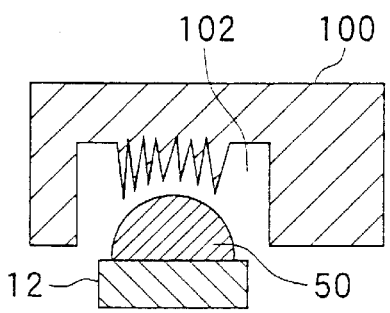
Figure 9D:
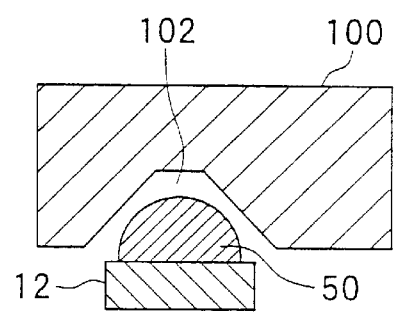
Figure 9E:
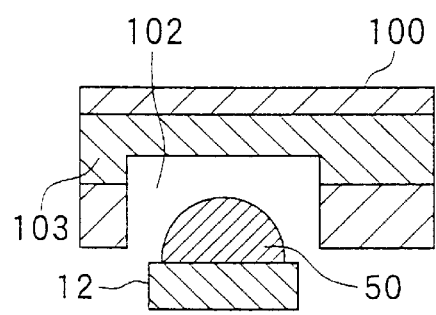
Figure 9F:
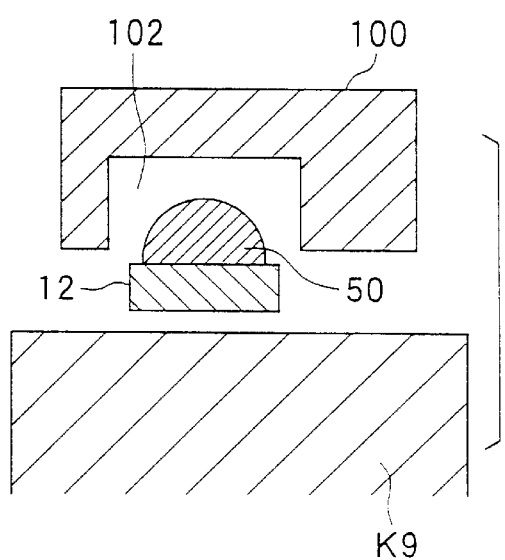

In the shaping method using the mask 100, various modifications can be enumerated, as shown in FIGS. 9A–9F, as devices for making the pad 50 more crushable. As shown in FIGS. 9A, 9B, 9C and 9D, the bottom face of the recess 102 to abut against the pad 50 at the shaping time is sharpened. As shown in FIG. 9E, the bottom face of the recess 102 is hardened by making it of hardened steel (hardened portion) 103. Further, as shown in FIG. 9F, the ceramic substrate 10 may be placed on a heater K9, and the pad 50 may be heated and softened for the shaping and printing operations.

Modifications

Here, the wiring substrate is not limited to the aforementioned ceramic substrate 10 but may be a glass epoxy substrate which has the wiring portion made of copper or silver like the aforementioned one. Alternatively, the body of the lead frame may be plated with silver. In this case, the body of the lead frame corresponds to the wiring substrate, and the plated silver corresponds to the wiring portion.

The aforementioned plasma cleaning step S2 and heating step S4 may be performed, if necessary, but may be omitted, as the case may be. The arrangement of the conductive jointing material may be made not only by the mask printing but also by a selectively applying method.

In short, the present invention resides in an electronic part packaging method in which an electronic part is mounted on a wiring substrate through a conductive jointing material arranged on a wiring substrate and in which a wiring portion formed on the wiring substrate and an electronic part are wire-bonded, and has a gist in that the pad forming step S3 is executed before the conductive jointing material arranging step S5. The detail may be suitably modified.

What is claimed is:

1. An electronic part mounting method comprising the steps of:

disposing a conductive jointing material on a portion of a surface of a substrate, the substrate having a first wiring on the surface thereof;

mounting an electronic part on the portion of the substrate through the conductive jointing material;

wire-bonding the electronic part to the first wiring through a wire; and prior to the disposing of the conductive jointing material, disposing a metal pad on an area of the first wiring where the wire is bonding.

2. An electronic part mounting method according to claim 1, wherein said metal pad and said first wiring having said metal pad are subjected to heat treatment after said metal pad is formed and before said conductive jointing material is disposed on said portion of said surface of said substrate.

3. An electronic part mounting method according to claim 2, wherein the heat treatment is performed in a nitrogen gas atmosphere or a hydrogen gas atmosphere.

4. An electronic part mounting method according to claim 2, wherein the heat treatment is performed at 200° C. or higher and for 10 minutes or longer.

5. The electronic part mounting method according to claim 1, wherein the substrate second wiring at the portion on which the electronic part is mounted, the conductive jointing material being disposed on the portion having the second wiring.

6. The electronic part mounting method according to claim 5, wherein the substrate has a third wiring on the surface thereof, the conductive jointing material being disposed on the third wiring, another electronic part being bonded by the conductive jointing material to the third wiring.

7. The electronic part mounting method according to claim 6, wherein the second wiring and the third wiring, each having surfaces on which the conductive jointing material is disposed are, respectively, free from the metal pad.

8. An electronic part mounting method according to claim 1, wherein said metal pad is formed by using a wire bonding wire.

9. An electronic part mounting method according to claim 8, wherein said metal pad is formed into a protuberant shape by using a ball bonding method.

10. An electronic part mounting method according to claim 9, wherein after said metal pad is formed into said protuberant shape, a top end area of said metal pad is deformed into a flat shape by pushing said top end area of said metal pad.

11. An electronic part mounting method according to claim 10, wherein said conductive jointing material is disposed over said substrate by printing said conductive jointing material while a mask member having an opening at a desired portion covers said substrate, and when said mask member covers said substrate, said mask member pushes the top end area of said metal pad.

12. An electronic part mounting method according to claim 11, wherein said mask member has a recess formed in its portion for pushing the top end area of said metal pad, and shape of said recess restricts a deformation of the top end area of said metal pad.

13. An electronic part mounting method according to claim 9, wherein after said metal pad is formed into said protuberant shape, a top end area of said metal pad is cut off to form a surface of remaining portion of said metal pad into a flat face.

14. An electronic part mounting method according to claim 1, wherein said metal pad is formed by rubbing the area of said first wiring where the wire is bonding with a member made of gold, so that said metal pad is formed into a film.

15. An electronic part mounting method according to claim 1, wherein said metal pad is formed by applying a leaf made of gold to the area of said first wiring where the wire is bonding, so that said metal pad is formed into a film.

16. An electronic part mounting method according to claim 1, wherein said conductive jointing material is disposed over said substrate by printing said conductive jointing material while a mask member having an opening at a desired portion covers said substrate, and said mask member has a recess formed in its portion for covering said metal pad, and said recess has at least a thickness of said metal pad.

said recess has at least a thickness of said metal pad.

17. An electronic part mounting method according to claim 1, wherein said metal pad is made of metal as being selected from the group consisting of gold (Au), silver (Ag), aluminum (Al), copper (Cu), palladium (Pd), platinum (Pt), tin (Sn), and nickel (Ni).

18. An electronic part mounting method according to claim 1, wherein said metal pad is made of gold (Au), said first wiring is made of copper (Cu), and a wire used for the wire-bonding is made of gold (Au).

19. An electronic part mounting method according to claim 1, wherein plasma cleaning for cleaning said substrate including said first wiring is performed before said metal pad is formed.

20. An electronic part mounting method according to claim 18, wherein the plasma cleaning is performed in an atmosphere of a mixed gas of argon and hydrogen, by applying an electronic field of 500–750 W, and for 1–3 minutes.

* * * * *